(12) United States Patent
Hwang et al.

(10) Patent No.: US 9,178,023 B2
(45) Date of Patent: Nov. 3, 2015

(54) TWO TERMINAL SWITCHING DEVICE HAVING BIPOLAR SWITCHING PROPERTY, METHOD OF FABRICATING THE SAME, AND RESISTIVE MEMORY CROSS-POINT ARRAY HAVING THE SAME

(71) Applicant: POSTECH ACADEMY—INDUSTRY FOUNDATION, Pohang-si, Gyeongbuk (KR)

(72) Inventors: Hyunsang Hwang, Daegu (KR); Ji Yong Woo, Incheon (KR)

(73) Assignee: POSTECH ACADEMY—INDUSTRY FOUNDATION, Pohang-si, Gyeongbuk (KR)

( * ) Notice: Subject to any disclaimer, the term of this patent is extended or adjusted under 35 U.S.C. 154(b) by 0 days.

(21) Appl. No.: 14/229,817

(22) Filed: Mar. 28, 2014

(65) Prior Publication Data
US 2015/0048299 A1 Feb. 19, 2015

(30) Foreign Application Priority Data
Aug. 19, 2013 (KR) ........................ 10-2013-0097868

(51) Int. Cl.
*H01L 29/24* (2006.01)
*H01L 29/861* (2006.01)
*H01L 27/24* (2006.01)

(52) U.S. Cl.
CPC ............ *H01L 29/24* (2013.01); *H01L 27/2409* (2013.01); *H01L 29/861* (2013.01); *H01L 29/8615* (2013.01)

(58) Field of Classification Search
CPC .... H01L 29/24; H01L 29/861; H01L 29/8615
USPC .......................................................... 257/910
See application file for complete search history.

(56) References Cited

U.S. PATENT DOCUMENTS

| 8,891,284 | B2 * | 11/2014 | Williams et al. ............... 365/148 |
| 2011/0101336 | A1 * | 5/2011 | Yamazaki ........................ 257/43 |
| 2011/0121359 | A1 * | 5/2011 | Yang et al. ..................... 257/109 |
| 2011/0147696 | A1 | 6/2011 | Lee et al. |
| 2012/0113706 | A1 | 5/2012 | Williams et al. |
| 2012/0140543 | A1 * | 6/2012 | Liu et al. ........................ 365/100 |
| 2013/0214271 | A1 * | 8/2013 | Asami et al. ..................... 257/43 |
| 2014/0001465 | A1 * | 1/2014 | Yamazaki ........................ 257/43 |

FOREIGN PATENT DOCUMENTS

| KR | 10-2010-0007926 A | 1/2010 |
| KR | 10-2011-0072920 A | 6/2011 |
| KR | 10-2012-0046327 A | 5/2012 |

* cited by examiner

*Primary Examiner* — Allan R Wilson
(74) *Attorney, Agent, or Firm* — Nixon Peabody LLP; Joseph Bach, Esq.

(57) ABSTRACT

Provided are a two-terminal switching device having a bidirectional switching property, and a resistive memory crosspoint array including the same. The two-terminal switching device includes a first electrode. A first tunneling barrier layer is disposed on the first electrode. An oxide semiconductor layer is disposed on the first tunneling barrier layer. A second tunneling barrier layer is disposed on the oxide semiconductor layer. A second electrode is disposed on the second tunneling barrier layer.

21 Claims, 12 Drawing Sheets

TWO TERMINAL SWITCHING DEVICE HAVING BIPOLAR SWITCHING PROPERTY, METHOD OF FABRICATING THE SAME, AND RESISTIVE MEMORY CROSS-POINT ARRAY HAVING THE SAME

CROSS-REFERENCE TO RELATED APPLICATION

This application claims priority to Korean Patent Application No. 10-2013-0097868 filed on Aug. 19, 2013 in the Korean Intellectual Property Office (KIPO), the entire contents of which are hereby incorporated by reference.

BACKGROUND

1. Technical Field

Example embodiments of the present invention relate to a switching device, and more specifically, to a two-terminal switching device having a bidirectional switching property.

2. Related Art

Currently, a flash memory commercialized as a resistance change memory uses a change in threshold voltage according to storing charges in or removing charges from a charge storage layer. The charge storage layer may be a floating gate that is a polysilicon layer, or a charge trapping layer that is a silicon nitride layer. Recently, a next generation resistive memory devices having lower power consumption and higher integrity compared to the flash memory device is being studied. As an example of the new generation resistive memory devices, there are a phase change RAM (PRAM), a magnetoresistive RAM (MRAM), and a resistance change RAM (ReRAM).

In order to implement the resistive memory device as an array, a resistance device having memory characteristics and a selection device electrically connected to the resistance device are generally included. The selection device may be a transistor or a diode. However, a transistor has a limitation in reducing the size of a device due to a short channel effect such as punch-through. In addition, since current flows only in one direction in a normal diode (for example, see Korean Patent Publication No. 2010-0007926), it is not suitable for a bipolar device having bipolar variable resistance characteristics, such as a resistive device. In addition, since a gate electrode, source/drain areas, and source/drain electrodes should be formed in a transistor, it is not suitable for high integration.

SUMMARY OF THE INVENTION

The present invention is directed to a two-terminal switching device having a bipolar switching property, and a resistive memory cross-point array that includes one two-terminal switching device in a unit cell to improve integration.

According to an aspect of the present invention, there is provided a two-terminal switching device. The two-terminal switching device includes a first electrode. A first tunneling barrier layer is disposed on the first electrode. An oxide semiconductor layer is disposed on the first tunneling barrier layer. A second tunneling barrier layer is disposed on the oxide semiconductor layer. A second electrode is disposed on the second tunneling barrier layer.

The first tunneling barrier layer and the second tunneling barrier layer may be independently an insulating metal oxide layer or a metal nitride layer. The first tunneling barrier layer and the second tunneling barrier layer may be independently layers selected from the group consisting of $SiO_2$, $TiO_2$, $Al_2O_3$, $HfO_2$, $Si_3N_4$, $WO_3$, $SrTiO_3$, $LaAlO_3$, $Y_2O_3$, and $Ta_2O_5$. The first tunneling barrier layer and the second tunneling barrier layer may have a thickness of 2 to 10 nm independently.

The first tunneling barrier layer may be a $TiO_2$ layer. The oxide semiconductor layer may be a metal oxide layer including oxygen vacancies. The oxide semiconductor layer may have a higher concentration of oxygen vacancies at an interface in contact with the second tunneling barrier layer than at an interface in contact with the first tunneling barrier layer. The oxide semiconductor layer may have a concentration gradation of oxygen vacancies. Further, the second tunneling barrier layer and the oxide semiconductor layer may be oxide layers of the same metal. Specifically, the second tunneling barrier layer may be $Ta_2O_5$, and the oxide semiconductor layer may be $TaO_X$ ($0<x<2.5$).

The first electrode and the second electrode may be inactive metal layers with no reactivity with the first tunneling barrier layer and the second barrier layer which are respectively in contact therewith. Specifically, the first electrode and the second electrode may be independently Pt layer or Ir layer.

According to another aspect of the present invention, there is provided a method of fabricating a two-terminal switching device. First, a first electrode is formed. A first tunneling barrier layer is formed on the first electrode. A metal layer is formed on the first tunneling barrier layer. An oxide semiconductor layer and a second tunneling barrier layer sequentially stacked on the first tunneling barrier layer are formed by performing an oxygen treatment on the metal layer. A second electrode is formed on the second tunneling barrier layer.

The first tunneling barrier layer may be an insulating metal oxide layer or a metal nitride layer selected from the group consisting of $SiO_2$, $TiO_2$, $Al_2O_3$, $HfO_2$, $Si_3N_4$, $WO_3$, $SrTiO_3$, $LaAlO_3$, $Y_2O_3$, and $Ta_2O_5$. The metal layer may be Si, Al, Hf, W, Y, SrTi, LaAl, or Ta. The second tunneling barrier layer may be a stoichiometric metal oxide layer, and the oxide semiconductor layer may be a metal oxide layer including oxide vacancies. The oxide treatment may be a heat treatment performed in an oxidizing atmosphere.

According to still another aspect of the present invention, there is provided a resistive memory cross-point array. The resistive memory cross-point array includes a first electrode. A switching layer is disposed on the first electrode. The switching layer includes a sequentially disposed first tunneling barrier layer, oxide semiconductor layer, and second tunneling barrier layer. A second electrode is disposed on the switching layer. A variable resistance layer is disposed on the second electrode. A third electrode is disposed on the variable resistance layer.

The variable resistance layer may be a bipolar variable resistance layer. The first tunneling barrier layer may be a $TiO_2$ layer. The second tunneling barrier layer may be $Ta_2O_5$ and the oxide semiconductor layer may be $TaO_X$ ($0<x<2.5$).

BRIEF DESCRIPTION OF THE DRAWINGS

Example embodiments of the present invention will become more apparent by describing in detail example embodiments of the present invention with reference to the accompanying drawings, in which.

DESCRIPTION OF EXAMPLE EMBODIMENTS

Example embodiments of the present invention are disclosed herein. However, specific structural and functional details disclosed herein are merely representative for purposes of describing example embodiments of the present invention, and thus example embodiments of the present invention may be embodied in many alternate forms and should not be construed as limited to example embodiments of the present invention set forth herein.

It will be understood that when a layer is referred to as being "on" another layer or a substrate, the layer may be formed directly on the other layer or the substrate, or an intervening layer may exist between the layer and the other layer or the substrate. Furthermore, throughout this disclosure, directional terms such as "upper," "upper (portion)," and "upper surface" may also encompass meanings of "lower," "lower (portion)," and "lower surface," or "side," "side (portion)," and "side surface." That is, a spatial direction is construed as a relative direction, instead of an absolute direction.

It will be understood that, although the terms "first," "second," etc. may be used herein to describe various elements, these elements should not be limited by these terms. These terms are only used to distinguish one element from another.

In the drawings, the thicknesses of layers and regions may be exaggerated or omitted for clarity. Like numerals refer to like elements throughout the description of the figures.

Figure 1:
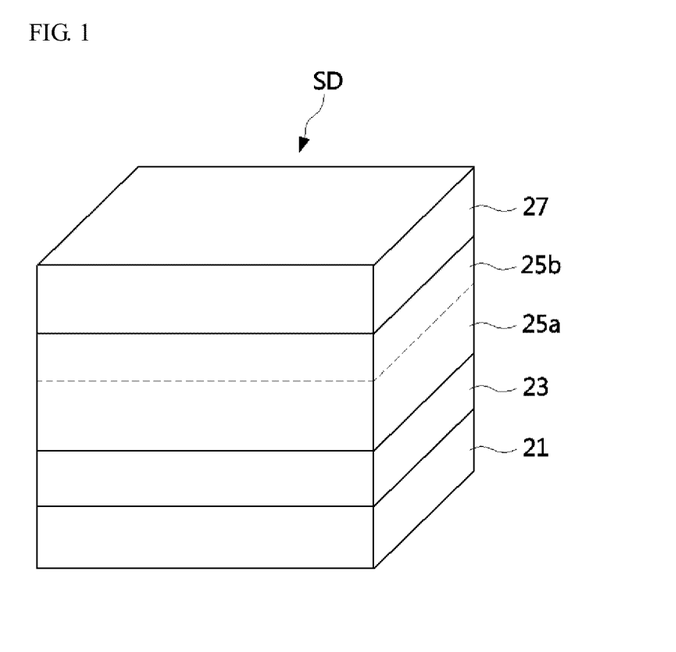
FIG. 1 is a perspective view for describing a switching device in accordance with an embodiment of the present invention.

FIG. 1 is a perspective view for describing a switching device in accordance with an embodiment of the present invention.

Referring to FIG. 1, a two-terminal switching device includes a first electrode 21, a first tunneling barrier layer 23, an oxide semiconductor layer 25a, a second tunneling barrier layer 25b, and a second electrode 27.

The first tunneling barrier layer 23 and the second tunneling barrier layer 25b may be layers through which electrons can tunnel when an electric field applied to both ends thereof reaches a predetermined value or more. The first tunneling barrier layer 23 and the second tunneling barrier layer 25b may be insulating layers. Each of the first tunneling barrier layer 23 and the second tunneling barrier layer 25b may be a metal oxide or metal nitride layer having a thickness of about 2 to 10 nm and satisfying stoichiometry. More specifically, the first tunneling barrier layer 23 and the second tunneling barrier layer 25b are independently an insulating metal oxide layer or a metal nitride layer selected from the group consisting of $SiO_2$, $TiO_2$, $Al_2O_3$, $HfO_2$, $Si_3N_4$, $WO_3$, $SrTiO_3$, $LaAlO_3$, $Y_2O_3$, and $Ta_2O_5$. The first tunneling barrier layer 23 and the second tunneling barrier layer 25b may be the same material layer, or different material layers. As an example, the first tunneling barrier layer 23 may be a $TiO_2$ layer, and the second tunneling barrier layer 25b may be a $Ta_2O_5$ layer.

The oxide semiconductor layer 25a may be a metal oxide layer that contains oxide vacancies and does not satisfy stoichiometry. When the oxide semiconductor layer 25a contains oxide vacancies, conductivity of the oxide semiconductor layer 25a may be controlled depending on the concentration of the oxide vacancies. The oxide semiconductor layer 25a may include $SiO_X (0<x<2)$, $TiO_X (0<x<2)$, $AlO_X (0<x<1.5)$, $HfO_X (0<x<2)$, $WO_X (0<x<3)$, $SrTiO_X (0<x<3)$, $LaAlO_X (0<x<3)$, $YO_X (0<x<1.5)$, or $TaO_X (0<x<2.5)$. As an example, the oxide semiconductor layer 25a may include $TaO_X (0<x<2.5)$. In addition, the oxide semiconductor layer 25a may have a higher concentration of the oxide vacancies at an interface in contact with the second tunneling barrier layer 25b than at an interface in contact with the first tunneling barrier layer 23. In addition, the concentration of the oxide vacancies in the oxide semiconductor layer 25a may gradually change.

In some embodiments, the second tunneling barrier layer 25b and the oxide semiconductor layer 25a may be the same metal oxide layer. Further, the second tunneling barrier layer 25b may be a stoichiometric metal oxide layer, and the oxide semiconductor layer 25a may be a non-stoichiometric metal oxide layer containing oxide vacancies. As an example, the second tunneling barrier layer 25b may include $Ta_2O_5$, and the oxide semiconductor layer 25a may be TaOx (0<x<2.5).

The first electrode 21 and the second electrode 27 may be metal layers, for example, metal layers independently selected from the group consisting of Al, W, Pt, Ti, TiN, TaN, WN, and Cu. In some embodiments, the first electrode 21 and the second electrode 27 may be inactive metal layers which have almost no reactivity with the first and second tunneling barrier layers 23 and 25b which are in contact with the first electrode 21 and the second electrode 27, respectively, for example, a metal layer having a work function of about 5 eV to 6 eV. More specifically, the first electrode 21 and the second electrode 27 may be a Pt layer having a work function of about 5.65 eV or an Ir layer having a work function of about 5.27 eV.

When a voltage smaller than a threshold voltage is applied between the first electrode 21 and the second electrode 27, probability of direct tunneling of electrons may be reduced by including two layers of the tunneling barrier layers 23 and 25b. Accordingly, off-current may be reduced compared to a case including a single tunneling barrier layer. On the other hand, when a voltage greater than the threshold voltage is applied between the first electrode 21 and the second electrode 27, electrons can tunnel through the first tunneling barrier layer 23 and the second tunneling barrier layer 25b. More specifically, electrons can tunnel through the first tunneling barrier layer 23 and the second tunneling barrier layer 25b by Fowler-Nordheim tunneling (F-N tunneling). Here, since the oxide semiconductor layer 25a is disposed between the first tunneling barrier layer 23 and the second tunneling barrier layer 25b, electrons which tunnel through one of the first tunneling barrier layer 23 and the second tunneling barrier layer 25b are conducted in the oxide semiconductor layer 25a, and then tunnel through the other of the first tunneling barrier layer 23 and the second tunneling barrier layer 25b. As a result, since a device can be turned on regardless of the direction in which a voltage is applied, bidirectional switching can be implemented. In addition, since on-current reduction is not so much compared to the case of employing a single tunneling barrier layer, selectivity can be improved.

Figure 2A:
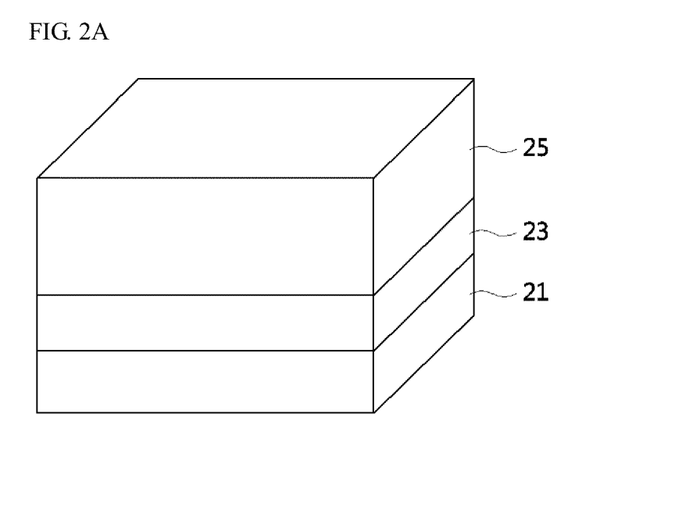
FIGS. 2A and 2B are cross-sectional views for describing a method of fabricating a switching device in accordance with an embodiment of the present invention.
Figure 2B:
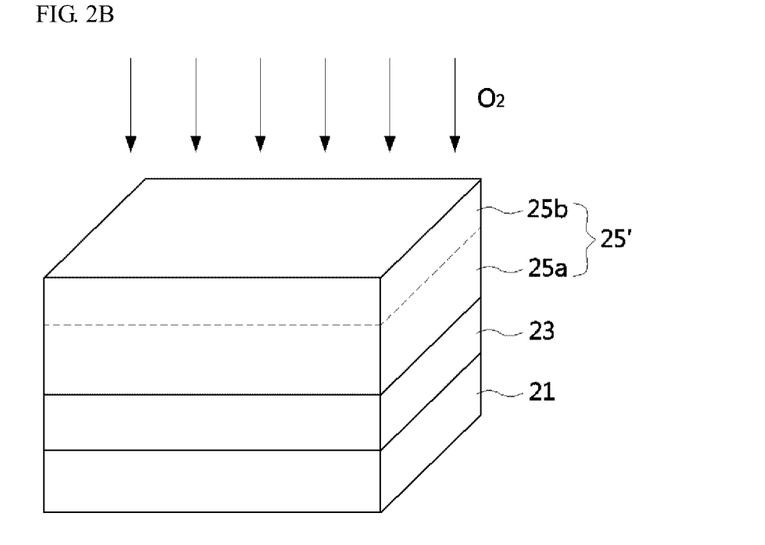

FIGS. 2A and 2B are cross-sectional views for describing a method of fabricating a switching device in accordance with an embodiment of the present invention.

Referring to FIG. 2A, a first tunneling barrier layer 23 may be formed on a first electrode 21. The first electrode 21 may be formed by a sputtering method. The first tunneling barrier layer 23 may be formed to have a thickness of about 2 to 10 nm by an atomic layer deposition (ALD) method. The first tunneling barrier layer 23 may be an insulating metal oxide or metal nitride layer selected from the group consisting of $SiO_2$, $TiO_2$, $Al_2O_3$, $HfO_2$, $Si_3N_4$, $WO_3$, $SrTiO_3$, $LaAlO_3$, $Y_2O_3$, and $Ta_2O_5$.

A metal layer 25 may be formed on the first tunneling barrier layer 23. The metal layer 25 may include Si, Ti, Al, Hf, W, Y, SrTi, LaAl, or Ta, and have a thickness of about 10 to 20 nm. The metal layer 25 may be a transition metal layer.

Referring to FIG. 2B, an oxygen treatment may be performed on the metal layer 25. More specifically, a heat treatment may be performed on a product with the metal layer 25 formed thereon in air or an oxygen atmosphere. As a result, the metal layer 25 is oxidized to be a metal oxide layer 25'. However, the concentration of oxygen in the metal oxide layer 25' may be greater in an upper portion than in a lower portion. An upper portion 25b of the metal oxide layer 25' may be a stoichiometric layer which includes few oxygen vacancies, and a lower portion 25a of the metal oxide layer 25' may be a non-stoichiometric metal oxide layer which includes oxygen vacancies. Here, the upper portion 25b may be referred to as a second tunneling barrier layer 25b, and the lower portion 25a may be referred to as an oxide semiconductor layer 25a. The second tunneling barrier layer 25b may include $SiO_2$, $TiO_2$, $Al_2O_3$, $HfO_2$, $WO_3$, $SrTiO_3$, $LaAlO_3$, $Y_2O_3$, or $Ta_2O_5$, and the oxide semiconductor layer 25a may include $SiO_X$ (0<x<2), $TiO_X$ (0<x<2), $AlO_X$ (0<x<1.5), $HfO_X$ (0<x<2), $WO_X$ (0<x<3), $SrTiO_X$ (0<x<3), $LaAlO_X$ (0<x<3), $YO_X$ (0<x<1.5), or $TaO_X$ (0<x<2.5).

However, the present invention is not limited thereto, and the first electrode 21, the first tunneling barrier layer 23, the oxide semiconductor layer 25a, the second tunneling barrier layer 25b, and the second electrode 27 may be formed independently using a physical vapor deposition method, such as a sputtering method, a pulsed laser deposition (PLD) method, a thermal evaporation method, and an electron-beam evaporation method, a molecular beam epitaxy (MBE) method, a chemical vapor deposition (CVD) method, or an atomic layer deposition (ALD) method.

Figure 3:
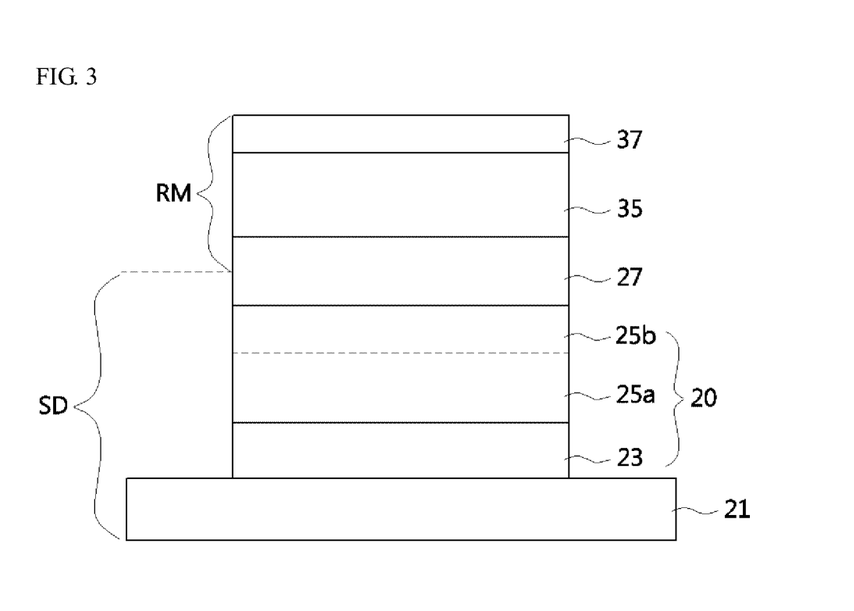
FIG. 3 is a cross-sectional view for describing a resistive memory cross-point array in accordance with an embodiment of the present invention, which is limited to a unit cell.

FIG. 3 is a cross-sectional view for describing a resistive memory cross-point array in accordance with an embodiment of the present invention, which is limited to a unit cell.

Referring to FIG. 3, a first electrode 21 is formed. The first electrode 21 may be formed to extend in a direction. A switching layer 20, a second electrode 27, and a variable resistor layer 35 may be sequentially formed on the first electrode 21. A third electrode 37 extending in a direction crossing the first electrode 21 may be formed on the variable resistor layer 35. Accordingly, a stacked structure of the switching layer 20, the second electrode 27, and the variable resistor layer 35 may be disposed at an intersection of the first and third electrodes 21 and 37.

The first electrode 21, the switching layer 20, and the second electrode 27 may configure a two-terminal switching device SD, and the second electrode 27, the variable resistor layer 35, and the third electrode 37 may configure a variable resistance device RM. However, the present invention is not limited thereto, and the second electrode 27 may include a lower intermediate electrode (not shown) and an upper intermediate electrode (not shown) which are different material layers. In this case, the first electrode 21, the switching layer 20, and the lower intermediate electrode (not shown) may configure the two-terminal switching device SD, and the upper intermediate electrode (not shown), the variable resistor layer 35, and the third electrode 37 may configure the variable resistance device RM.

Further, the first electrode 21 may function as a word line, or an additional word line may be connected to the first electrode 21. In addition, the third electrode 37 may function as a bit line, or an additional bit line may be connected to the third electrode 37.

The first electrode 21 and the second electrode 27 (or the lower intermediate electrode) which are disposed at both ends of the switching layer 20 may correspond to the first electrode 21 and the second electrode 27 described with reference to FIG. 1, respectively. In addition, the switching layer 20 may include a first tunneling barrier layer 23, an oxide semiconductor layer 25a, and a second tunneling barrier layer 25b as described with reference to FIG. 1.

The variable resistor layer 35 may be a bipolar variable resistor layer. The variable resistance device RM including the variable resistor layer 35 may be a magnetoresistive random access memory (MRAM), more specifically a spin transfer torque MRAM, a phase-change random access memory (PRAM), or a resistive random access memory (RRAM).

When the variable resistance device RM is an RRAM, the variable resistor layer 35 may be a bipolar variable resistor layer, more specifically, a resistance-variable memory layer having a bipolar property. As an example, the variable resistor layer 35 may be a metal oxide layer, a chalcogenide layer, a perovskite layer, or a metal-doped solid electrolyte layer. The metal oxide layer may include $SiO_2$, $Al_2O_3$, or a transition metal oxide layer. The transition metal oxide layer may include $HfO_{2-x}$, $MnO_{2-x}$, $ZrO_{2-x}$, $Y_2O_{3-x}$, $TiO_{2-x}$, $NiO_{1-y}$, $Nb_2O_{5-x}$, $Ta_2O_{5-x}$, $CuO_{1-y}$, $Fe_2O_{3-x}$, (for example, $0<x<1.5$ and $0<y<0.5$), or a lanthanoid oxide layer. The lanthanoids may be La (Lanthanum), Ce (Cerium), Pr (Praseodymium), Nd (Neodymium), Sm (Samarium), Gd (Gadolinium), or Dy (Dysprosium). The chalcogenide layer may be a GeSbTe layer or a GeTeO (for example, $Ge_2Te_2O_5$) layer, and the perovskite layer may be a $SrTiO_3$ layer, a Cr- or Nb-doped $SrZrO_3$ layer, a $Pr_{1-x}Ca_xMnO_3$ (PCMO, $0<x<1$) layer, or a $La_{1-x}Ca_xMnO_3$, (LCMO, $0<x<1$, for example, X=0.3) layer. In addition, the metal-doped solid electrolyte layer may be a layer in which Ag is doped into GeSe, that is, an AgGeSe layer, a layer in which Cu is doped into $HfO_2$, or a layer in which Cu is doped into $TiO_2$.

In some embodiments, the variable resistor layer 35 may be a metal-doped solid electrolyte layer. In this case, when a set voltage is applied to the variable resistance device RM, the variable resistor layer 35 may be changed to have low resistance since a metal doped into the solid electrolyte layer forms a filament. In addition, when a reset voltage is applied to the variable resistance device RM, the variable resistor layer 35 may be changed to have high resistance while the metal filament is broken. In this case, the third electrode 37 in contact with the variable resistor layer 35 may be the same material layer as the metal doped into the solid electrolyte layer.

Figure 4A:
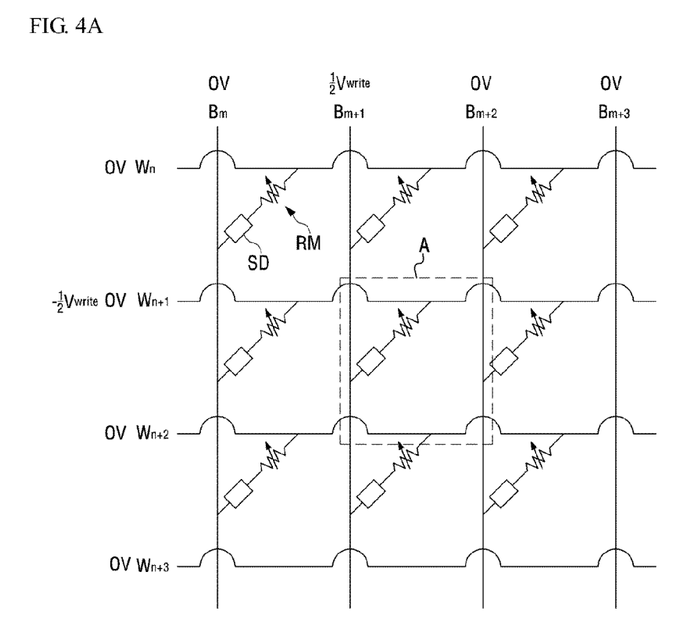
FIG. 4A is a schematic diagram for describing a method of forward writing of a resistive memory cross-point array in accordance with an embodiment of the present invention.

FIG. 4A is a schematic diagram for describing a method of forward writing of a resistive memory cross-point array in accordance with an embodiment of the present invention.

Referring to FIG. 4A, a plurality of first data lines, that is, word lines (Wn, Wn+1, Wn+2, and Wn+3) and a plurality of second data lines crossing the word lines, that is, bit lines (Bm, Bm+1, Bm+2, Bm+3) are arranged. A two-terminal switching device SD and a variable resistance device RM which are connected in series are arranged at an intersection of each word line and each bit line. In FIG. 4A, the two-terminal switching device SD is connected to the bit line, and the variable resistance device RM is connected to the word line. However, the present invention is not limited thereto, and locations of the two-terminal switching device SD and the variable resistance device RM may be interchangeable.

½Vwrite is applied to a selected bit line (Bm+1) among the bit lines, and a ground voltage is applied to unselected bit lines (Bm, Bm+2, and Bm+3). −½Vwrite is applied to a selected word line (Wn+1) among the word lines (Wn, Wn+1, Wn+2, and Wn+3), and the ground voltage is applied to unselected word lines (Wm, Wm+2, and Wm+3). Vwrite is applied to a selected unit cell A disposed at an intersection of the selected bit line (Bm+1) and the selected word line (Wn+1), and 0V, ½Vwrite, or −½Vwrite is applied to the remaining unselected unit cells.

Vwrite may have a value of a threshold voltage or more of the two-terminal switching device SD, and a value of a set voltage or more of the variable resistance device RM. ½Vwrite may have a value less than the set voltage of the variable resistance device RM. Accordingly, the variable resistance device RM may be selectively changed to a low resistance state LRS, only in the selected unit cell A. On the other hand, in the unselected unit cells, the variable resistance device RM may be unchanged and maintain the previous state.

Figure 4B:
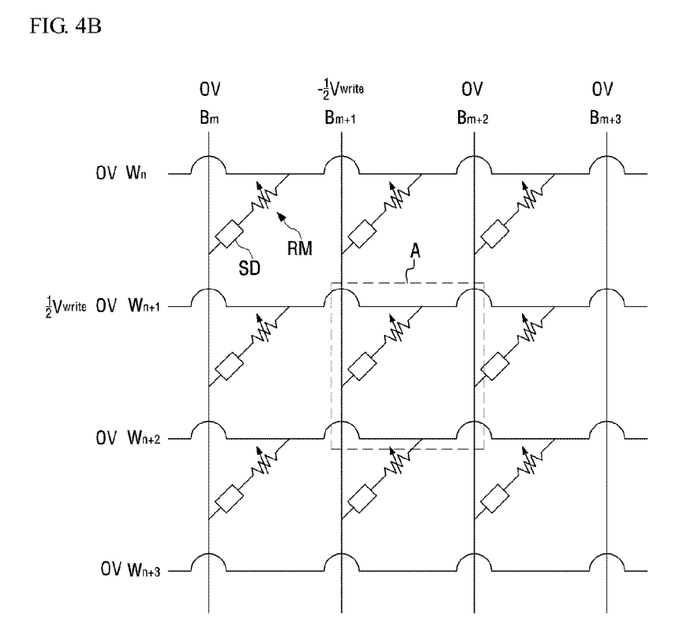
FIG. 4B is a schematic diagram for describing a method of reverse writing of a resistive memory cross-point array in accordance with an embodiment of the present invention.

FIG. 4B is a schematic diagram for describing a method of reverse writing of a resistive memory cross-point array in accordance with an embodiment of the present invention. The method of reverse writing in accordance with the embodiment of the present invention is similar to the method of forward writing described with reference to FIG. 4A except that to be described later.

Referring to FIG. 4B, −½Vwrite is applied to a selected bit line (Bm+1) among the bit lines, and a ground voltage is applied to unselected bit lines (Bm, Bm+2, and Bm+3). ½Vwrite is applied to a selected word line (Wn+1) among the word lines (Wn, Wn+1, Wn+2, and Wn+3), and the ground voltage is applied to unselected word lines (Wm, Wm+2, and Wm+3). −Vwrite is applied to a selected unit cell A disposed at an intersection of the selected bit line (Bm+1) and the selected word line (Wn+1), and 0V, ½Vwrite, or −½Vwrite is applied to the remaining unselected unit cells.

−Vwrite may be the same as or less than a reverse direction threshold voltage of the two-terminal switching device SD, and the same as or less than a reset voltage of the variable resistance device RM. Accordingly, the variable resistance device RM may be selectively changed to a high resistance state HRS only in the selected unit cell A. On the other hand, the variable resistance device RM may be unchanged and maintain the previous state in the unselected unit cells.

Hereinafter, preferred experimental examples will be provided to facilitate easy understanding of the present invention. It should be understood, however, that there is no intent to limit the scope of invention to the following experimental examples.

EXPERIMENTAL EXAMPLES

Switching Device Preparation Examples 1 to 8

A $SiO_2$ layer having a thickness of about 100 nm was formed on a substrate including a Pt layer as a first electrode. A contact hole having a diameter of about 250 nm and exposing the first electrode was formed in the $SiO_2$ layer. A first tunneling barrier layer was formed in the contact hole by depositing $TiO_2$ to have a thickness about 4 nm by performing an ALD process at 150° C. A Ta layer was deposited to have a thickness about 16 nm on the first tunneling barrier layer using a sputtering method. A heat treatment was performed on a product with the Ta layer formed thereon in an oxygen atmosphere at 300° C. Next, a second electrode was formed using a sputtering method.

Methods of fabricating Switching Device Preparation Examples by performing a heat treatment on the product with a Ta layer formed thereon for different times, or using different second electrode materials are summarized in Table 1.

TABLE 1

| Preparation examples of switching device | Heat treatment time | Second electrode material |
|---|---|---|
| 1 | 10 min. | Pt |
| 2 | 15 min. | |
| 3 | 20 min. | |
| 4 | 30 min. | |
| 5 | 40 min. | |
| 6 | 30 min. | Ni |

TABLE 1-continued

| Preparation examples of switching device | Heat treatment time | Second electrode material |
|---|---|---|
| 7 | | W |
| 8 | | Ti |

Switching Device Preparation Example 9

A SiO2 layer having a thickness of about 100 nm was formed on a substrate including a Pt layer as a first electrode. A contact hole having a diameter of about 250 nm and exposing the first electrode was formed in the $SiO_2$ layer. A first tunneling barrier layer was formed in the contact hole by depositing $TiO_2$ to have a thickness about 4 nm by performing an ALD process at 150° C. A $Ta_2O_5$ layer having a thickness of about 16 nm was formed on the first tunneling barrier layer using a sputtering method. Next, a second electrode was formed using a sputtering method.

Switching Device Preparation Example 10

A switching device was manufactured using the same method as Switching Device Preparation Example 4 except that an $HfO_2$ layer having a thickness of about 4 nm was formed instead of a $TiO_2$ layer on a Pt layer which is a first electrode using an ALD method.

Switching Device Preparation Example 11

A switching device was manufactured using the same method as Switching Device Preparation Example 4 except that an $Al_2O_3$ layer having a thickness of about 4 nm was formed instead of a $TiO_2$ layer on a Pt layer which is a first electrode using an ALD method.

Switching Device Preparation Example 12

A switching device was manufactured using the same method as Switching Device Preparation Example 4 except that the $TiO_2$ layer was not formed on a Pt layer which is a first electrode.

Figure 5:
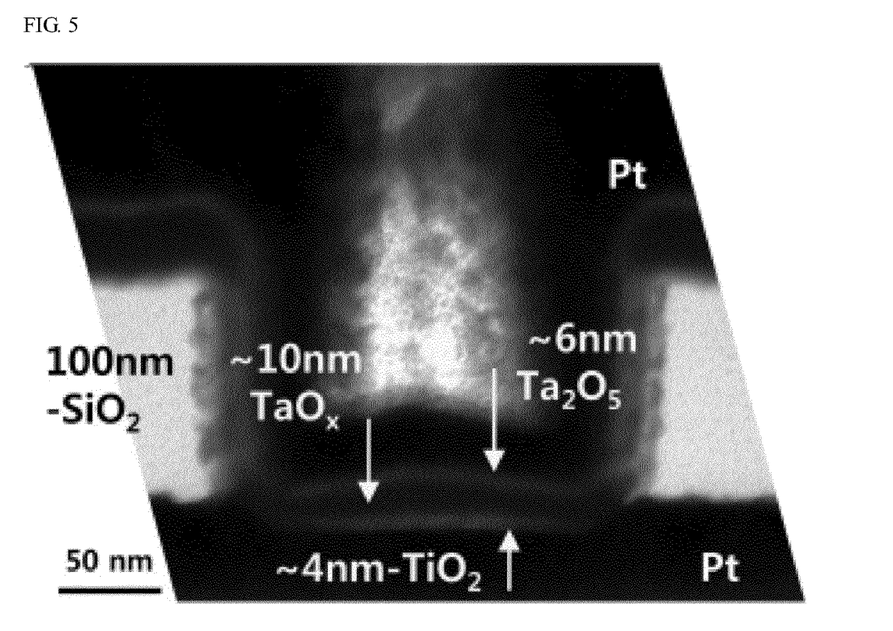
FIGS. 5 and 6 are a TEM photograph showing a cross-section of a switching device in accordance with Switching Device Preparation Example 4, and a graph showing an X-ray photoelectron spectroscopy (XPS) depth profile of a switching device in accordance with Switching Device Preparation Example 4, respectively.
Figure 6:
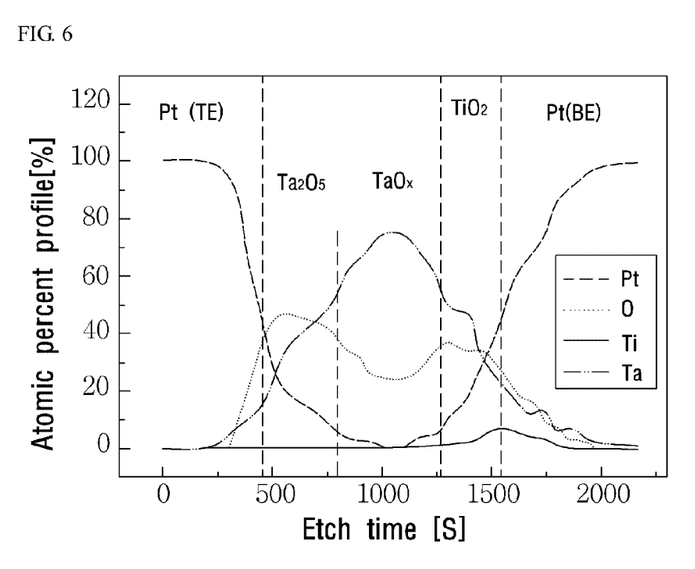

FIGS. 5 and 6 are a TEM photograph showing a cross-section of a switching device in accordance with Switching Device Preparation Example 4, and a graph showing an X-ray photoelectron spectroscopy (XPS) depth profile of a switching device in accordance with Switching Device Preparation Example 4, respectively.

Referring to FIGS. 5 and 6, a Ta layer heat-treated in an oxygen atmosphere has a higher oxygen concentration at an area adjacent to the second electrode than at an area adjacent to the first tunneling barrier layer ($TiO_2$ layer). Further, the Ta layer heat-treated in an oxygen atmosphere includes a $Ta_2O_5$ layer, that is, a second tunneling barrier layer at the area adjacent to the second electrode, and a $TaO_x$ layer (0<x<2) as an oxide semiconductor layer that contains oxide vacancies and does not satisfy stoichiometry at the remaining area. Meanwhile, the $Ta_2O_5$ layer was formed to about 6 nm, and the $TaO_x$ layer was formed to about 10 nm.

Figure 7:
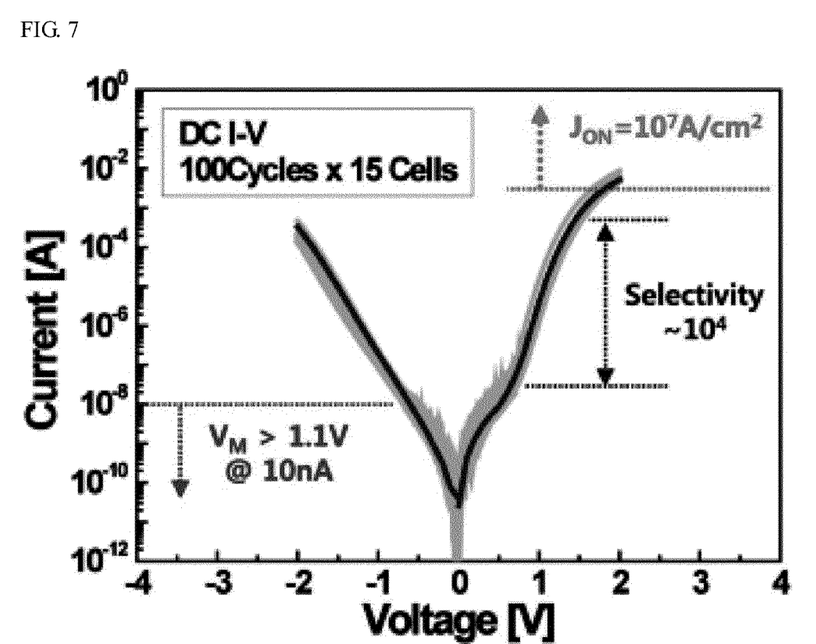
FIG. 7 is a graph showing current-voltage characteristics of a switching device in accordance with Switching Device Preparation Example 4.

FIG. 7 is a graph showing current-voltage characteristics of a switching device in accordance with Switching Device Preparation Example 4. Specifically, current-voltage characteristics of 15 switching devices were measured for 100 cycles.

Referring to FIG. 7, the switching device in accordance with Switching Device Preparation Example 4 shows typical current-voltage characteristics of a selection device. Specifically, the switching device in accordance with Switching Device Preparation Example 4 shows a sufficiently high current density ($10^7$ A/cm$^2$ or more), high selectivity (~$10^7$), and a high voltage margin (1.1 V or more).

Figure 8:
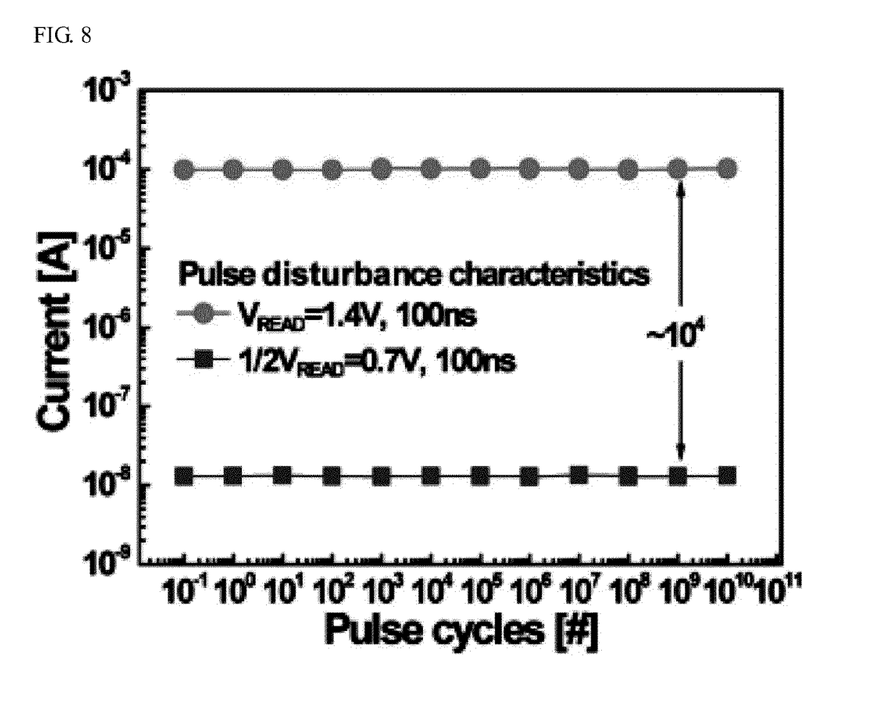
FIGS. 8 and 9 are a graph showing current variation with respect to a pulse voltage applied to a switching device in accordance with Switching Device Preparation Example 4, and a graph showing a result of a thermal stress test performed at 85° C., respectively.
Figure 9:
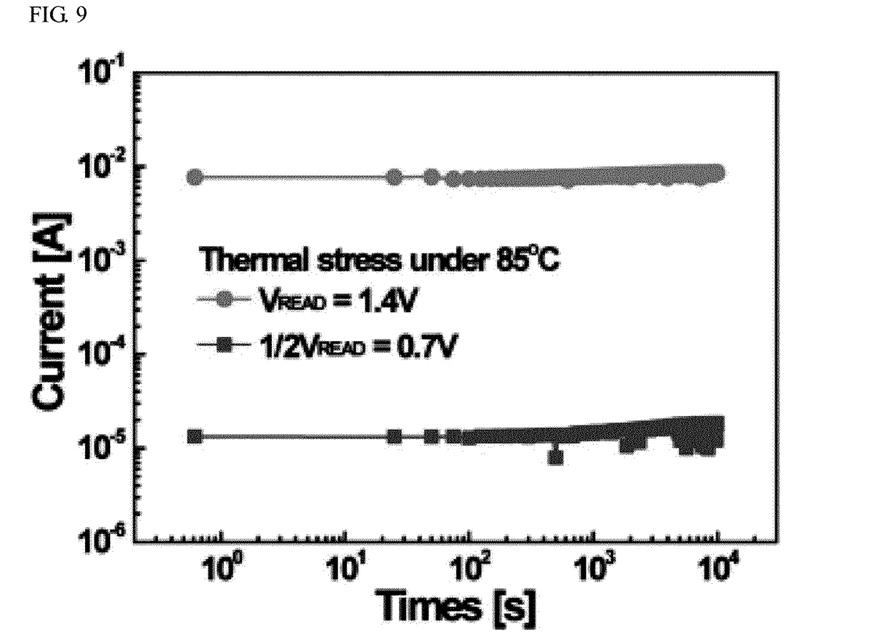

FIGS. 8 and 9 are a graph showing current variation with respect to a pulse voltage applied to the switching device in accordance with Switching Device Preparation Example 4, and a graph showing a result of a thermal stress test performed at 85° C., respectively.

Referring to FIGS. 8 and 9, it can be seen that the switching device in accordance with Switching Device Preparation Example 4 has excellent pulse disturbance characteristics and stable thermal stress endurance even under a high temperature (85° C.), resulting in high reliability.

Figure 10:
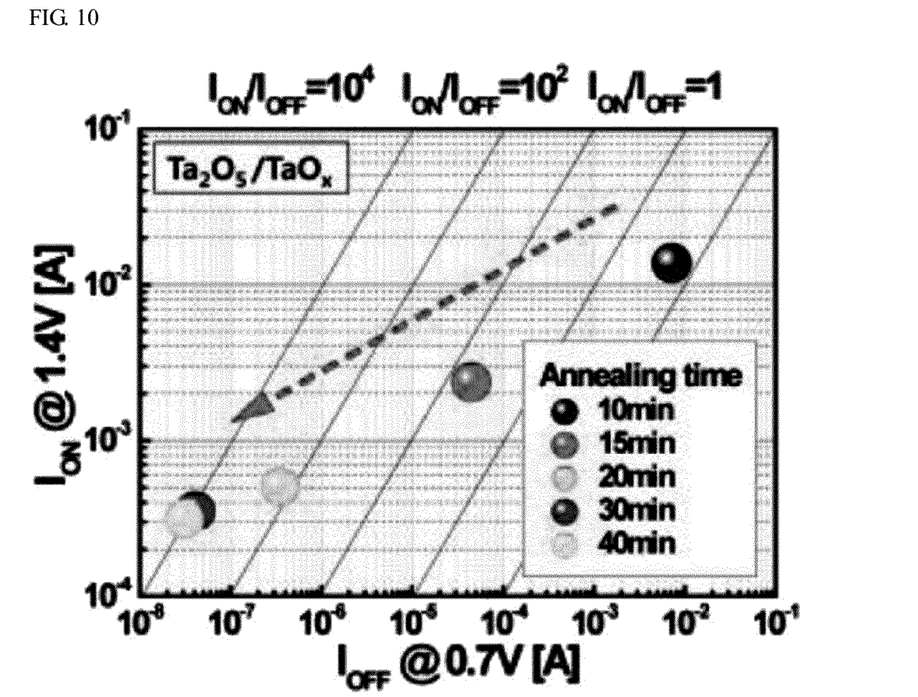
FIG. 10 is a graph showing off-current vs. on-current characteristics of switching devices in accordance with Switching Device Preparation Examples 1 to 5.
Figure 11:
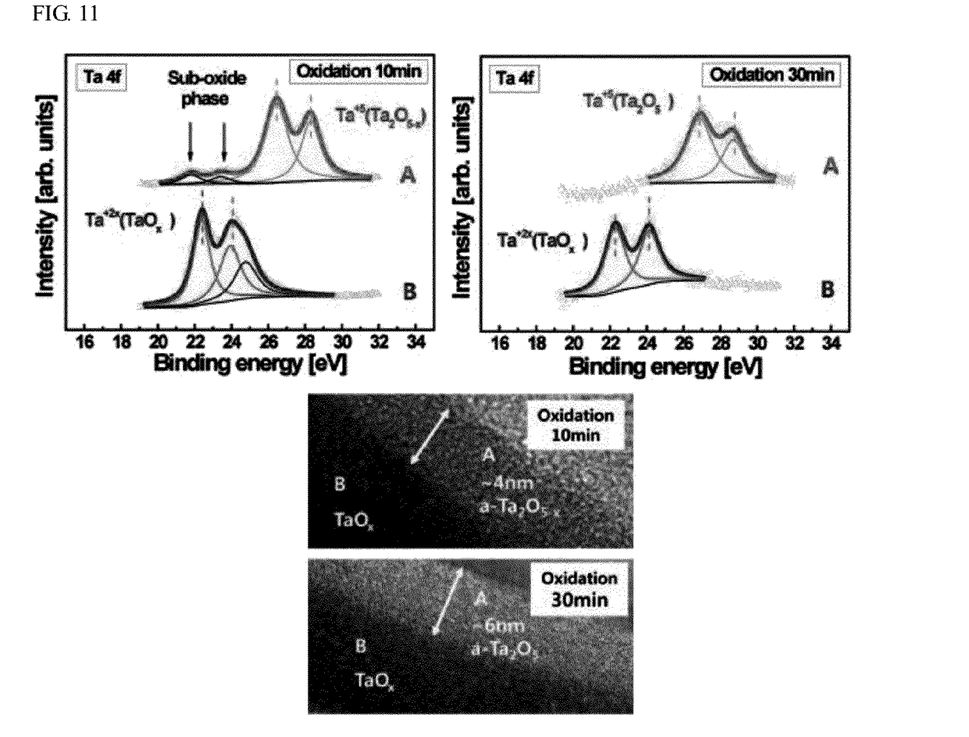
FIG. 11 shows an XPS spectrum and a TEM photograph of a $Ta_2O_5$ layer (A) and a $TaO_x$ layer (B) of switching devices in accordance with Switching Device Preparation Examples 1 and 4.

FIG. 10 is a graph showing on-current vs. off-current characteristics of the switching devices in accordance with Switching Device Preparation Examples 1 to 5, and FIG. 11 shows an XPS spectrum and a TEM photograph of a $Ta_2O_5$ layer (A) and a $TaO_x$ layer (B) in switching devices in accordance with Switching Device Preparation Examples 1 and 4.

Referring to FIG. 10, as the time of heat treatment for oxidizing an upper portion of a Ta layer increases, off-current reduction is more rapid than on-current reduction, and as a result, selectivity increases. In addition, it can be seen that the selectivity does not increase any more when the time of heat treatment is longer than 30 min. This means that the $Ta_2O_5$ layer shows good selectivity when having an appropriate thickness (about 6 nm).

Referring to FIG. 11, in order to have good selectivity, the upper portion of the Ta layer needs to be sufficiently oxidized and changed into a stoichiometric layer, that is, a $Ta_2O_5$ layer, with no sub-oxide phase.

Figure 12:
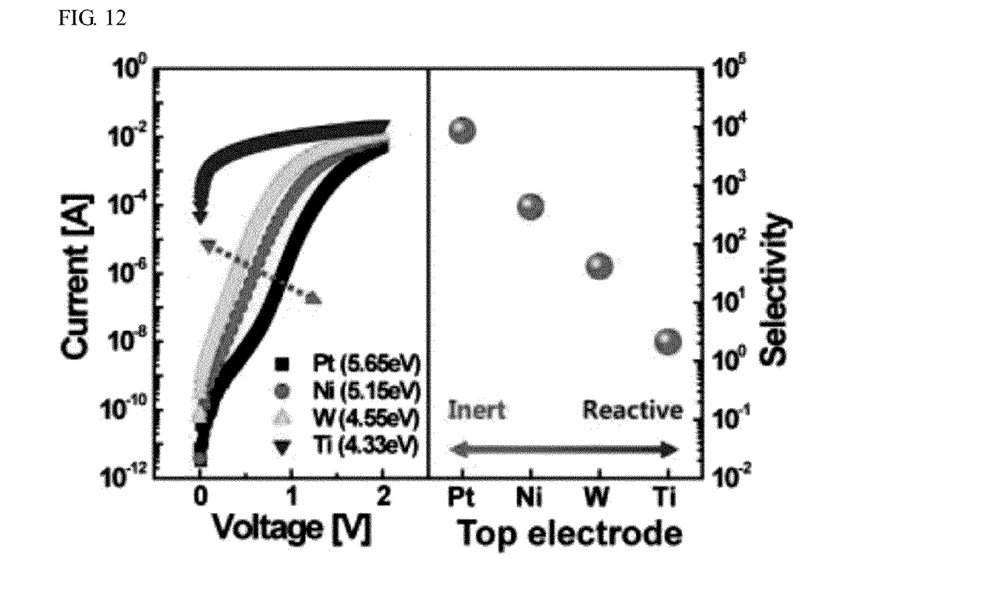
FIG. 12 is a graph showing current-voltage characteristics and resultant selectivities of switching devices in accordance with Switching Device Preparation Examples 4, and 6 to 8.

FIG. 12 is a graph showing current-voltage characteristics and resultant selectivities of switching devices in accordance with Switching Device Preparation Examples 4, and 6 to 8.

Referring to FIG. 12, when a chemically inactive electrode (an electrode having a high work function) is used as the second electrode, higher selectivity can be obtained. That is because the chemically inactive electrode is less reactive with oxygen and thus does not reduce the concentration of oxygen in the $Ta_2O_5$ layer. From the result, it is preferable that the work function of the second electrode is 5.2 eV or more.

Figure 13:
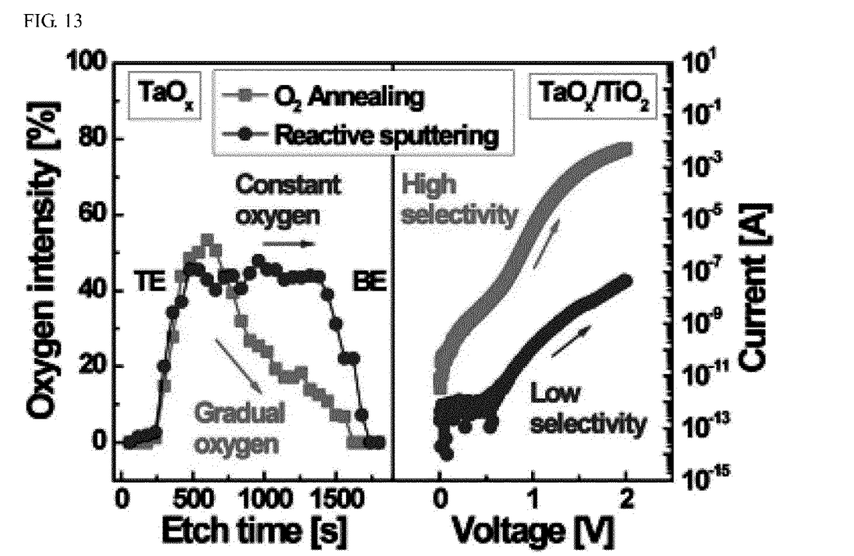
FIG. 13 is a graph showing XPS depth profiles and current-voltage characteristics of switching devices in accordance with Switching Device Preparation Examples 4 and 9.

FIG. 13 is a graph showing XPS depth profiles and current-voltage characteristics of switching devices in accordance with Switching Device Preparation Examples 4 and 9.

Referring to FIG. 13, higher selectivity can be obtained when forming a Ta layer of about 16 nm, and then performing a heat treatment on the Ta layer in an oxygen atmosphere to form a $Ta_2O_5$ layer of about 6 nm and a TaOx layer of about 10 nm than when forming a $Ta_2O_5$ layer of about 16 nm using a sputtering method (Switching Device Preparation Example 9).

Figure 14:
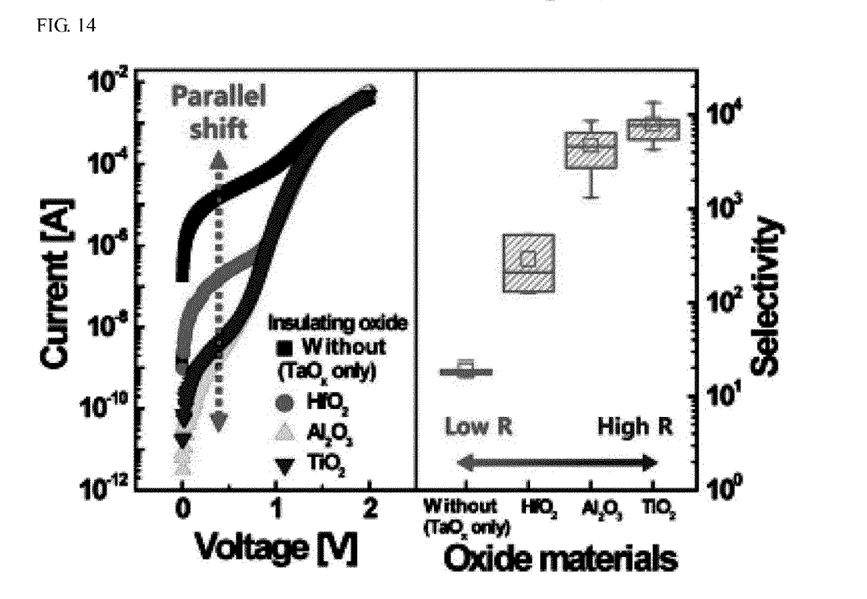
FIG. 14 is a graph showing current-voltage characteristics of switching devices in accordance with Switching Device Preparation Examples 4, and 10 to 12, and selectivities obtained therefrom.

FIG. 14 is a graph showing current-voltage characteristics and selectivities obtained therefrom, of switching devices in accordance with Switching Device Preparation Examples 4, and 10 to 12, Referring to FIG. 14, in order of when the first tunneling barrier layer is not formed (Switching Device Preparation Example 12), when an $HfO_2$ layer is formed as the first tunneling barrier layer (Switching Device Preparation Example 10), when an $Al_2O_3$ layer is formed (Switching Device Preparation Example 11), and when a $TiO_2$ layer is formed (Switching Device Preparation Example 4), off-currents of the switching devices decrease and selectivities of the switching devices increase. The decrease in off-currents may be caused by resistance of the first tunneling barrier layer.

Figure 15:
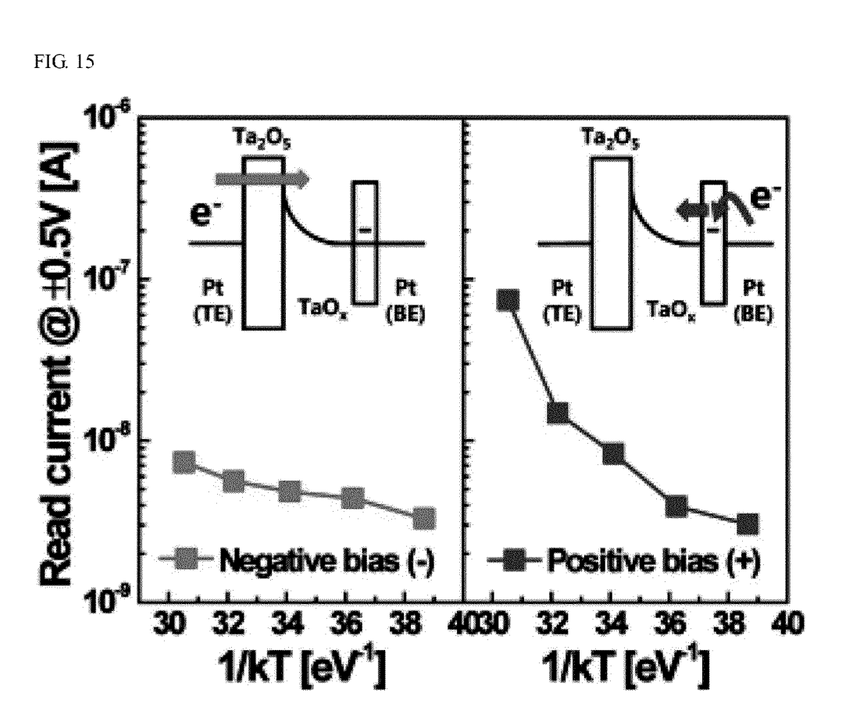
FIG. 15 is a graph showing current characteristics with respect to a temperature in a switching device in accordance with Switching Device Preparation Example 4.

FIG. 15 is a graph showing current characteristics with respect to a temperature in a switching device in accordance with Switching Device Preparation Example 4.

Referring to FIG. 15, when −0.5V is applied (that is, a negative bias is applied) to the second electrode while a ground voltage is applied to the first electrode, tunneling characteristics are not significantly correlated with temperature changes. That is, when a negative bias is applied to the switching device, current characteristics of the switching device depend on electron tunneling through the second tunneling barrier layer ($Ta_2O_5$ layer). On the other hand, when 0.5V is applied (that is, a positive bias is applied) to the second electrode while a ground voltage is applied to the first electrode, the switching device has trap-related conduction characteristics depending on temperature changes. That is, when a positive bias is applied to the switching device, electrons are conducted through trap sites in the first tunneling barrier layer ($TiO_2$ layer).

Variable Resistance Device Cross-Point Array Preparation Example

A variable resistor layer was formed by depositing $TiO_2$ on the second electrode of the switching device of Switching Device Preparation Example 4 to have a thickness of about 4 nm using an ALD method at about 150° C. A Cu layer as a third electrode was formed on the variable resistor layer using a sputtering method. Here, a plurality of parallel first electrodes extend in a direction, and a plurality of parallel third electrodes extend in a direction crossing the first electrode. A first tunneling barrier layer, an oxide semiconductor layer, a second tunneling barrier layer, a second electrode, and a variable resistor layer were formed at an intersection area of the first electrode and the third electrode. The intersection area of the first electrode and the third electrode, that is, a cell area has a width of 150 nm. In addition, the number of cell areas was 1000.

Figure 16:
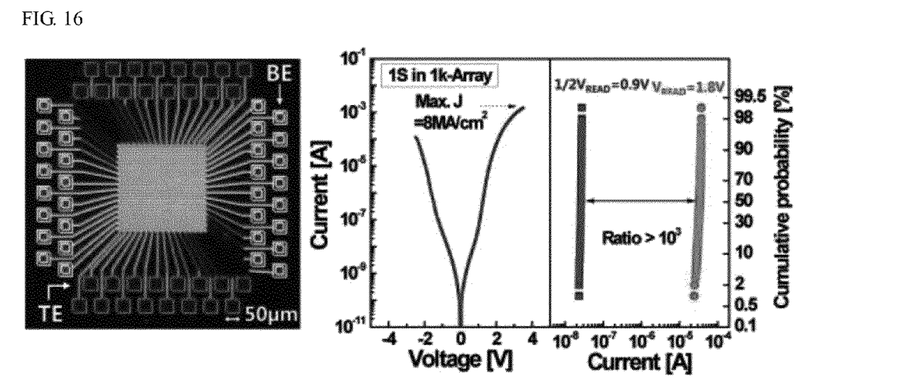
FIG. 16 shows a photograph, a current-voltage graph, and a current value at a specific field (0.9V and 1.8V) of a switching device cross-point array fabricated in accordance with Switching Device Preparation Example 4.

FIG. 16 shows a photograph, a current-voltage graph, and a current value at a specific field (0.9V and 1.8V) of a switching device cross-point array fabricated in accordance with Switching Device Preparation Example 4.

Referring to FIG. 16, the cross-point array shows a high current density of up to $8\times10^6$ A/cm$^2$ at 3.5V. Further, a sufficient selectivity of up to $10^3$ could be obtained with excellent uniformity.

Figure 17:
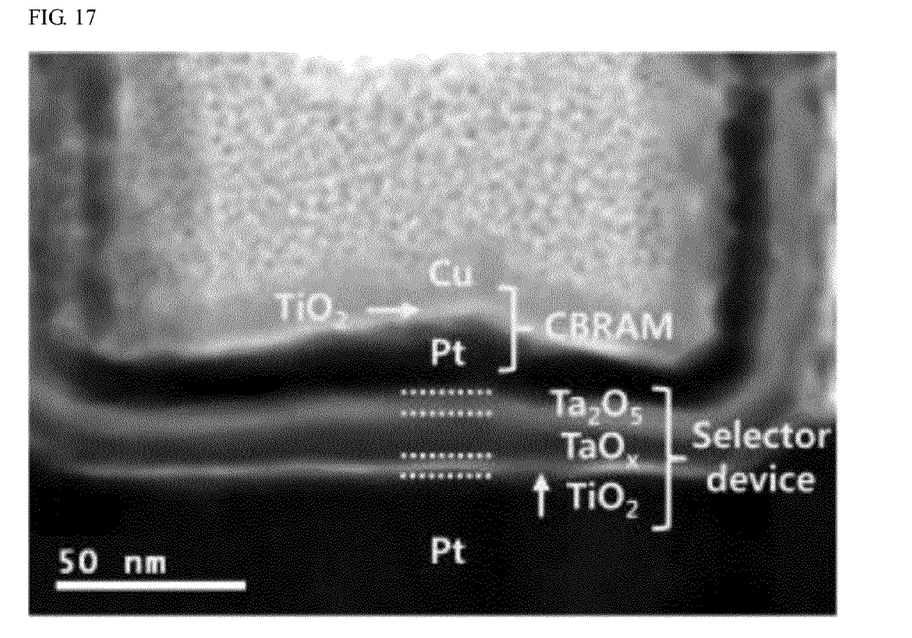
FIGS. 17 and 18 are respectively a SEM photograph showing a cross-section of a unit cell and a graph showing EDX line scan analysis, of a variable resistance device cross-point array fabricated in accordance with Variable Resistance Device Cross-Point Array Preparation Example.
Figure 18:
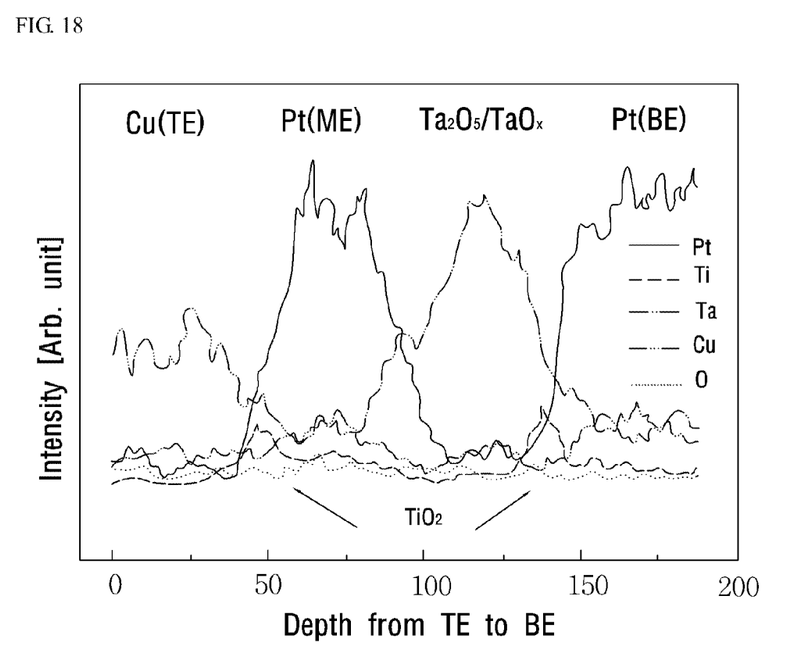

FIGS. 17 and 18 are a SEM photograph showing a cross-section of a unit cell and a graph showing EDX line scan analysis, of a variable resistance device cross-point array fabricated in accordance with Variable Resistance Device Cross-Point Array Preparation Example, respectively.

Referring to FIGS. 17 and 18, a unit cell of a device having a structure of $Pt/TiO_2/TaO_x/Ta_2O_5/Pt/TiO_2/Cu$ was formed.

Figure 19:
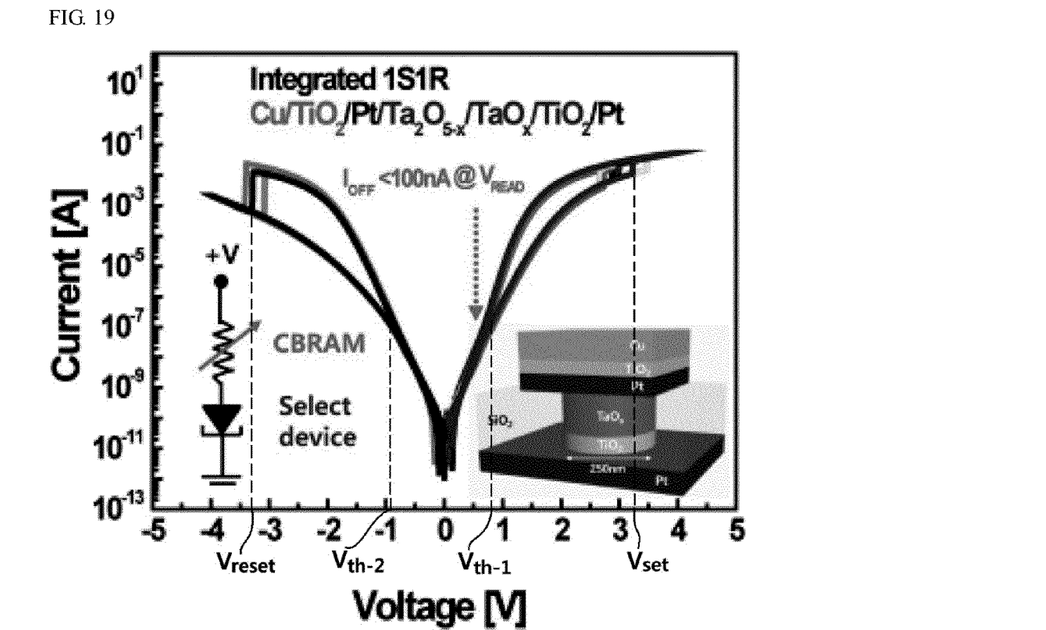
FIG. 19 is a current-voltage graph of a unit cell of a variable resistance device cross-point array fabricated in accordance with Variable Resistance Device Cross-Point Array Preparation Example.
Figure 20:
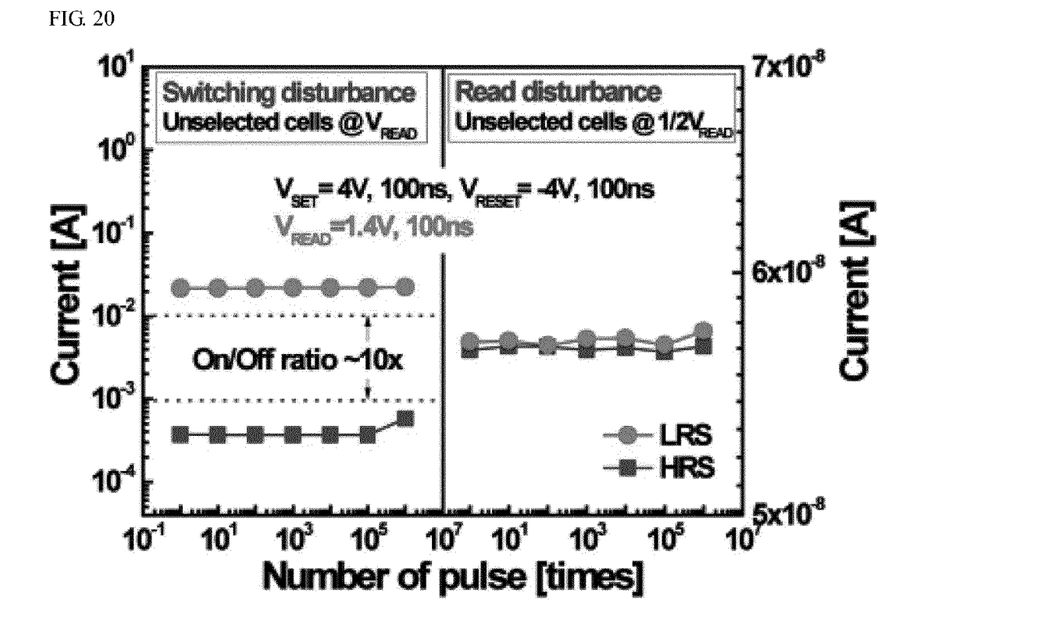
FIGS. 20 and 21 are respectively a graph showing switching/read disturbance and a graph showing constant voltage stress in a unit cell of a variable resistance device cross-point array fabricated in accordance with Variable Resistance Device Cross-Point Array Preparation Example.
Figure 21:
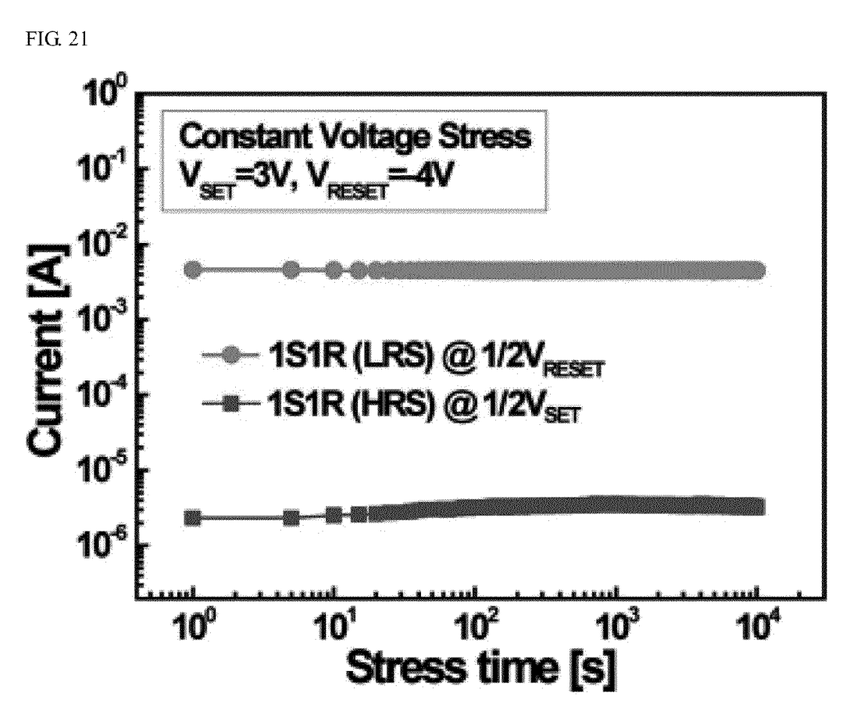

FIG. 19 is a current-voltage graph of a variable resistance device cross-point array fabricated in accordance with Variable Resistance Device Cross-Point Array Preparation Example. FIGS. 20 and 21 are a graph showing switching/read disturbance and a graph showing constant voltage stress in a unit cell of a variable resistance device cross-point array fabricated in accordance with Variable Resistance Device Cross-Point Array Preparation Example, respectively.

Referring to FIGS. 19, 20, and 21, a forward threshold voltage (Vth_1) of the switching device is about 0.7V, and a reverse threshold voltage (Vth_2) of the switching device is about −0.7V. In addition, a set voltage of the variable resistance device is about 4V, and a reset voltage is about −4V. Accordingly, Vwrite described with reference to FIGS. 4A and 4B may be set to about 4V which is the set voltage, and −Vwrite may be set to about −4V which is the reset voltage.

In addition, when a voltage applied to a selected unit cell to read data of the selected unit cell (Vread) is set to about 1.4V, the ratio of on-current to off-current may be 10 or more. In addition, the unit cell including the switching device shows excellent off-current characteristics, for example, an off-current of 100 nA or less in the range of 0 to 1V.

In addition, it can be seen that reliability characteristics related to switching/read disturbance or constant current stress are excellent.

According to the embodiments of the present invention, a two-terminal switching device includes an oxide semiconductor layer disposed between a pair of first and second barrier layers, and thus have symmetrical bipolar switching characteristics. In addition, a resistive memory cross-point array can have improved integrity by using the two-terminal switching device.

While the example embodiments of the present invention and their advantages have been described in detail, it should be understood that various changes, substitutions, and alterations might be made herein without departing from the scope of the invention.

What is claimed is:

1. A two-terminal switching device, comprising:
a first electrode;
a first tunneling barrier layer disposed on the first electrode;
an oxide semiconductor layer disposed on the first tunneling barrier layer;
a second tunneling barrier layer disposed on the oxide semiconductor layer;
a second electrode disposed on the second tunneling barrier layer,
wherein the first tunneling barrier layer and the second tunneling barrier layer are different material layers.

2. The two-terminal switching device of claim 1, wherein the first tunneling barrier layer and the second tunneling barrier layer are an insulating metal oxide layer or a metal nitride layer.

3. The two-terminal switching device of claim 2, wherein the first tunneling barrier layer and the second tunneling barrier layers are layers selected from the group consisting of $SiO_2$, $TiO_2$, $Al_2O_3$, $HfO_2$, $Si_3N_4$, $WO_3$, $SrTiO_3$, $LaAlO_3$, $Y_2O_3$, and $Ta_2O_5$.

4. The two-terminal switching device of claim 1, wherein the first tunneling barrier layer and the second tunneling barrier layer have a thickness of 2 to 10 nm independently.

5. The two-terminal switching device of claim 1, wherein the first tunneling barrier layer is a $TiO_2$ layer.

6. The two-terminal switching device of claim 1, wherein the oxide semiconductor layer is a metal oxide layer including oxygen vacancies.

7. The two-terminal switching device of claim 6, wherein the oxide semiconductor layer has a higher concentration of oxygen vacancies at an interface in contact with the second tunneling barrier layer than at an interface in contact with the first tunneling barrier layer.

8. The two-terminal switching device of claim 7, wherein the oxide semiconductor layer has a concentration gradation of oxygen vacancies.

9. The two-terminal switching device of claim 1 or 6, wherein the second tunneling barrier layer and the oxide semiconductor layer are oxide layers of the same metal.

10. The two-terminal switching device of claim 9, wherein the second tunneling barrier layer includes $Ta_2O_5$ and the oxide semiconductor layer includes $TaO_x$ (0<x<2.5).

11. The two-terminal switching device of claim 1, wherein the first electrode and the second electrode are inactive metal layers with no reactivity with the first tunneling barrier layer and the second barrier layer which are respectively in contact therewith.

12. The two-terminal switching device of claim 11, wherein the first electrode and the second electrode are independently Pt layer or Ir layer.

13. The two-terminal switching device of claim 1, wherein the first tunneling barrier layer is a $TiO_2$ layer, and the second tunneling barrier layer includes $Ta_2O_5$ and the oxide semiconductor layer includes $TaO_x$ ($0<x<2.5$).

14. A method of fabricating a two-terminal switching device, comprising:
    forming a first electrode;
    forming a first tunneling barrier layer on the first electrode;
    forming a metal layer on the first tunneling barrier layer;
    forming an oxide semiconductor layer and a second tunneling barrier layer sequentially stacked on the first tunneling barrier layer by performing an oxygen treatment on the metal layer; and
    forming a second electrode on the second tunneling barrier layer;
    wherein the first tunneling barrier layer and the second tunneling barrier layer are different material layers.

15. The method of claim 14, wherein the first tunneling barrier layer is an insulating metal oxide layer or a metal nitride layer selected from the group consisting of $SiO_2$, $TiO_2$, $Al_2O_3$, $HfO_2$, $Si_3N_4$, $WO_3$, $SrTiO_3$, $LaAlO_3$, $Y_2O_3$, and $Ta_2O_5$.

16. The method of claim 14, wherein the metal layer includes Si, Al, Hf, W, Y, SrTi, LaAl, or Ta.

17. The method of claim 14, wherein the second tunneling barrier layer is a stoichiometric metal oxide layer, and the oxide semiconductor layer is a metal oxide layer including oxide vacancies.

18. The method of claim 14, wherein the oxide treatment is a heat treatment performed in an oxidizing atmosphere.

19. A resistive memory cross-point array, comprising:
    a first electrode;
    a switching layer including a first tunneling barrier layer, an oxide semiconductor layer, and a second tunneling barrier layer sequentially disposed on the first electrode;
    a second electrode disposed on the switching layer;
    a variable resistance layer disposed on the second electrode; and
    a third electrode disposed on the variable resistance layer,
    wherein the first tunneling barrier layer and the second tunneling barrier layer are different material layers.

20. The resistive memory cross-point array of claim 19, wherein the variable resistance layer is a bipolar variable resistance layer.

21. The resistive memory cross-point array of claim 19, wherein the first tunneling barrier layer is a $TiO_2$ layer, and the second tunneling barrier layer includes $Ta_2O_5$ and the oxide semiconductor layer includes $TaO_x$ ($0<x<2$).

* * * * *